United States Patent [19]
Celauro et al.

[11] Patent Number: 6,075,204
[45] Date of Patent: Jun. 13, 2000

[54] ELECTRONICS ENCLOSURE FOR USE IN A FOOD PROCESSING ENVIRONMENT

[75] Inventors: Paul J. Celauro, Three Bridges, N.J.; John J. Leszcynski, Nashville, Tenn.

[73] Assignee: The BOC Group, Inc., New Providence, N.J.

[21] Appl. No.: 09/163,575

[22] Filed: Sep. 30, 1998

[51] Int. Cl.[7] .................................................. H05K 5/00
[52] U.S. Cl. ............................... 174/17 GF; 174/17 VA
[58] Field of Search .......................... 174/17 GF, 17 VA, 174/50

[56] References Cited

U.S. PATENT DOCUMENTS

| | | | |
|---|---|---|---|
| 2,990,443 | 6/1961 | Camilli | 174/17 GF |
| 3,916,080 | 10/1975 | Wakamatsu | 174/17 GF |
| 4,005,341 | 1/1977 | Uptegraff, Jr. et al. | 174/17 VA |
| 4,168,480 | 9/1979 | De Lucia | 174/17 GF |
| 4,237,333 | 12/1980 | Classon | 174/17 GF |
| 4,440,971 | 4/1984 | Harrold | 174/17 GF |
| 4,802,502 | 2/1989 | Williams | |
| 4,963,693 | 10/1990 | Kodl | |
| 5,101,710 | 4/1992 | Baucom | |
| 5,603,892 | 2/1997 | Grilletto et al. | |
| 5,668,349 | 9/1997 | Durham et al. | 174/17 VA |
| 5,773,755 | 6/1998 | Iwatare | 174/17 VA |

*Primary Examiner*—Dean A. Reichard
*Attorney, Agent, or Firm*—William A. Schoneman; Salvatore P. Pace

[57] ABSTRACT

In a food processing plant electronics used to monitor and control various food processing methods are subject to harsh environmental conditions such as thermal shock, outside contaminants and condensation. An electronics enclosure for minimizing such problems places the electronics in an interior enclosure which is separated from and surrounded by an exterior enclosure. Dry nitrogen gas is input to the interior box to create an internal pressure greater than ambient pressure. The gas is vented to the exterior box which is also maintained at greater than ambient pressure. Thermal shock is reduced by spacing the internal and external boxes apart using thermally non-conductive spacers.

20 Claims, 3 Drawing Sheets

ELECTRONICS ENCLOSURE FOR USE IN A FOOD PROCESSING ENVIRONMENT

BACKGROUND OF THE INVENTION

1. Field of the Invention

The present invention relates to an apparatus for enclosing the electronics used to monitor variables in food processing systems. More particularly, the present invention relates to an enclosure for protecting the electronics used in a food processing system from the harsh environmental conditions present in such systems.

2. Description of Related Art

The food industry produces a large quantity of standardized food products. In order to control the processes used to make standardized food products the industry is relying to a greater extent on electronic control systems which monitor various food manufacturing processes and input variables in order to control the quality of the food product as well as to minimize waste and decrease costs.

One difficulty in using sophisticated electronic circuitry in a food processing plant is the harsh environment present in such facilities. Food processing facilities such as poultry processors must wash and disinfect equipment used to manufacture poultry products with hot water at high pressures. A typical plant is cleaned using water at approximately 130–140 degrees Fahrenheit. Because the plants are often refrigerated to temperatures in the range of 38–45 degrees Fahrenheit, at lest in sections, certain of the electronic components are subject to significant thermal shocks when sprayed with the hot water during the cleaning process. Such thermal variations also result in condensation in standard electronics enclosures which would ultimately damage the electronics components.

An additional problem is created by the high pressure of the water used to clean the equipment. Water at more than 600 psi is often used to clean the food processing equipment near which the electronic monitoring and control systems must be located. Such water pressures can easily penetrate currently available electronics enclosures resulting in damage to the electronic circuitry therein.

Another hostile component of the food processing plant is the food being processes. Particles of food and fluids can lodge in hinges, crevices, seams, grooves, fittings, exposed threads and blind holes common on typical electronics packaging.

Due to the importance of the control and monitoring electronics in the production of high-quality standardized food products, the electronics cannot be removed for servicing without disrupting production. Presently available enclosures require the electronics and the enclosure be removed for servicing.

To date there is no electronics enclosure used in the food processing industry which will provide the necessary protection from water, water vapor, thermal heat transfer shock, condensation, and other problems described above.

U.S. Pat. No. 5,603,892 to Grilletto et al. provides for a gas purged electronics enclosure in which a control system is used to open and close valves in order to purge oxygen and water vapor from an electronic circuit package. This reference does not address the problems of thermal shock and also provides a more complex and expensive solution than the present invention.

In light of the foregoing, there is a need in the art for an electronics enclosure which is capable of withstanding the harsh environmental conditions present in the food processing plant while simultaneously permitting easy access to the electronics stored within.

SUMMARY OF THE INVENTION

Accordingly, the present invention is directed to an apparatus for enclosing electronic in order to minimize thermal shock and penetration from outside contaminants.

Furthermore, the invention is directed to an apparatus for enclosing electronics which reduces internal condensation.

In addition, the invention is directed to an apparatus for enclosing electronics so as minimize thermal shock and contamination while simultaneously enabling access to the electronics for servicing.

To achieve these and other advantages and in accordance with the purpose of the invention, as embodied and broadly described herein, the invention includes apparatus consisting of an inner enclosure surrounded by an external outer enclosure In one aspect of the invention the inner enclosure is an aluminum enclosure which is mounted to the inside of the top of the outer enclosure by standoffs creating an air gap between the two enclosures.

In another aspect of the invention a gas is input through the outer enclosure into the inner enclosure in order to create a positive flow of gas around the electronics out to the gap between the inner an outer enclosures and finally to the external environment.

In a further aspect of the invention the gas used is dry so as to absorb and carry away condensation and humidity inside the inner enclosure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings.

In accordance with the invention, an apparatus for the enclosure and protection of electronics in a harsh physical environment such as a food processing plant is disclosed in FIGS. 1–5.

Figure 1:
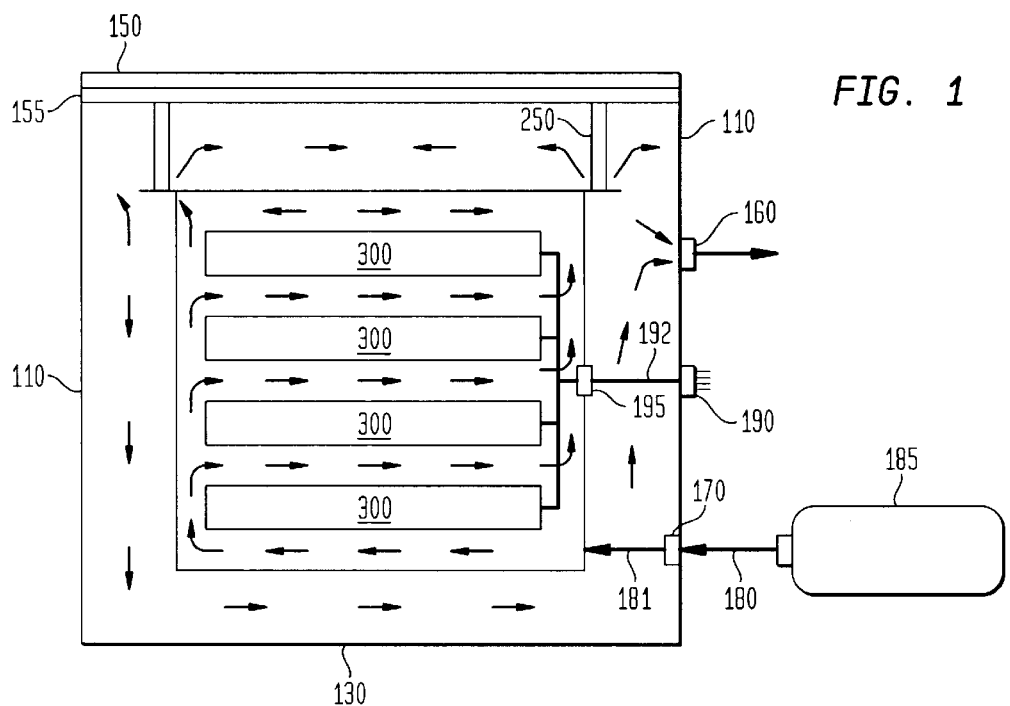
FIG. 1 is a diagrammatic representation of an apparatus according to the present invention.

In FIG. 1 a diagrammatic representation of the an apparatus according to the present invention is depicted. Outer enclosure 100 (also referred to as the external enclosure) is comprised of substantially planar side walls 110, end walls 120, bottom 130 and top 150. Inner enclosure 100 (also referred to as the internal enclosure) is comprised of similarly substantially planar side walls 210, end walls 220 and bottom 230. Inner enclosure 200 has a top 260 which is adapted so as to enable inner enclosure to be mounted on the inside of top 150 of the outer enclosure 100. Top 260 is mounted so that there is a space of approximately one inch between the inner and outer enclosures although other spacings may be appropriate depending on the designs constraints for a specific environment.

A gas source 185 must be in the vicinity of the enclosure so as to enable a constant flow of gas through the enclosure. Any inert gas may be used as gas source 185, however, it is preferred to use nitrogen or instrument air of relatively high purity so as to have a minimal moisture content. Gas from gas source 185 is directed to flow through gas conduit 180 through bulkhead fitting 170, gas conduit 181 and fitting 171 into inner enclosure 200. In inner enclosure 200 the gas will flow around electronic circuits 300 exiting at one or more vents 175 placed in at or near the top 260 of inner enclosure 200. Gas will then flow around the inner enclosure and out purge valve 160 when the pressure inside the enclosure exceeds a predetermined pressure, preferably in the range of 1–1.5 psi.

The above described gas flow will provide a positive pressure between the inner enclosure 200 and outer enclosure 100 in order to prevent dust, water droplets or other external contaminants from entering the inner enclosure. Furthermore, the dry nature of the input gas will result in a removal and/pr prevention of unwanted condensation or excess humidity in the inner enclosure 200thereby reducing the likelihood of corrosion of the electronic circuits 300 housed therein.

Electrical connections between external computers or electronics and the enclosed electronic circuits 300 are made through external receptacles 190 and conductors 192, connectors 195 and internal wiring 197 described in greater detail below.

Figure 2:
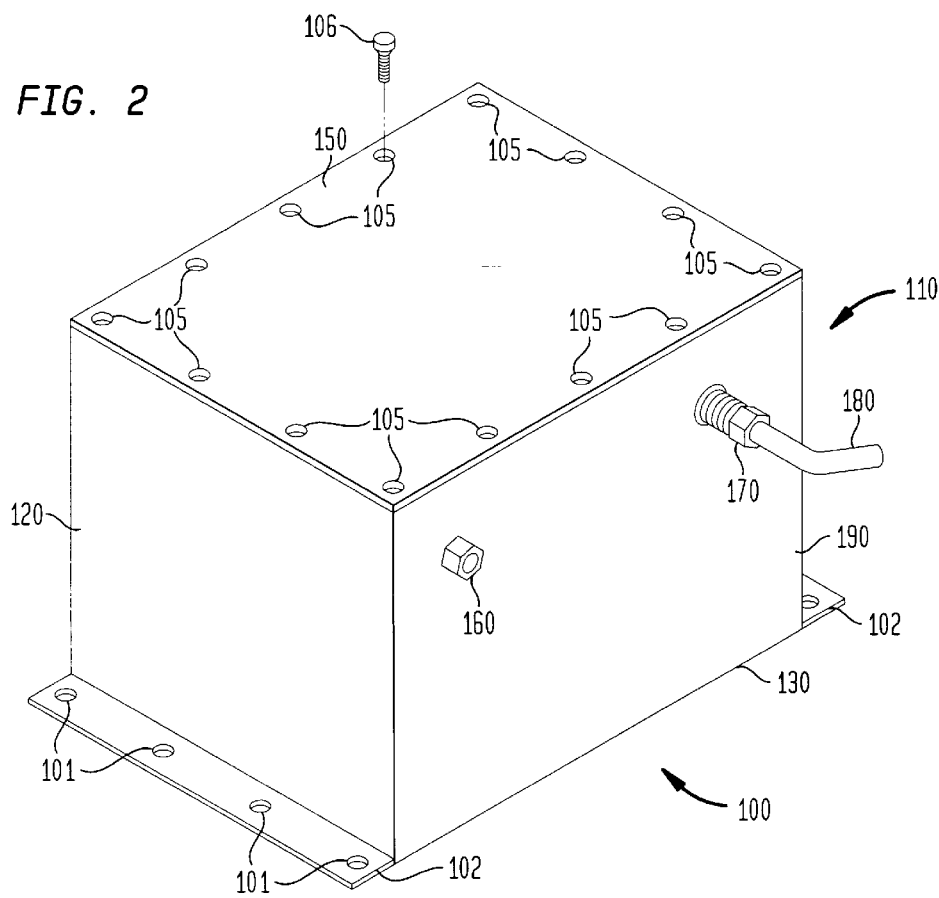
FIG. 2 is a schematic view of a preferred embodiment of the apparatus of the present invention showing the external surfaces of the external enclosure.
Figure 3:
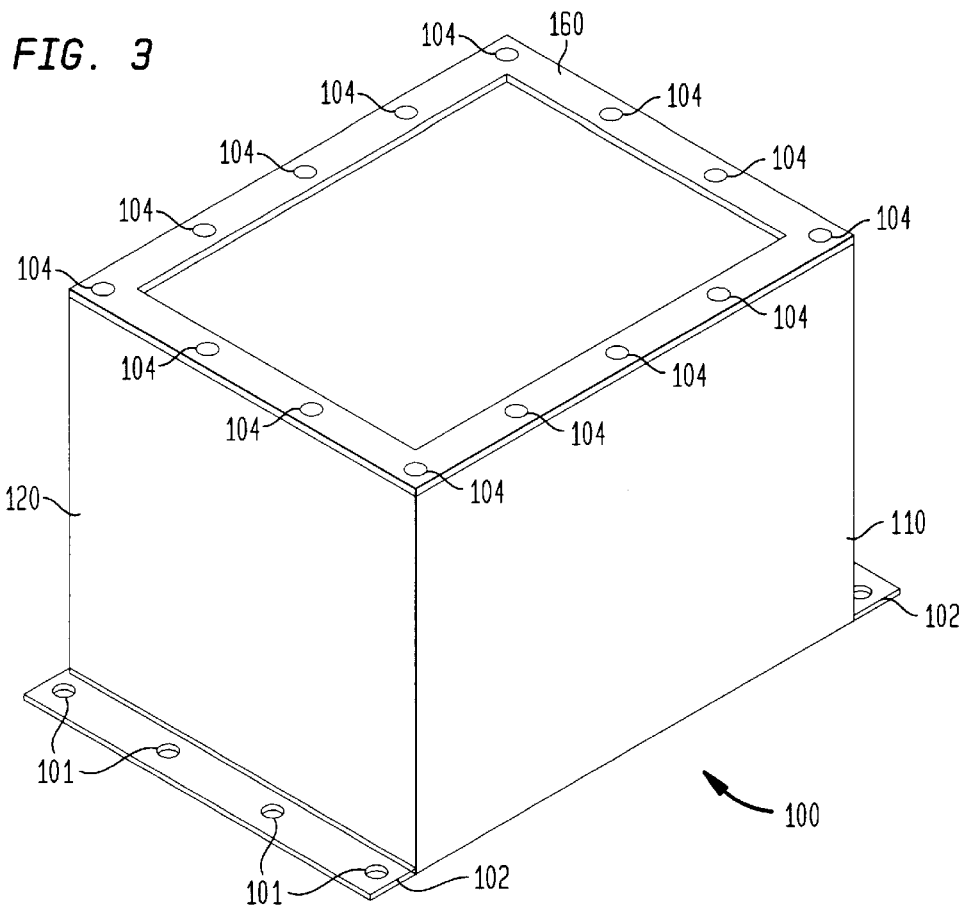
FIG. 3 is a schematic view of a preferred embodiment of the apparatus of the present invention showing the external enclosure of FIG. 1 from the opposite corner and with the top plate removed.

In FIG. 2 the outer enclosure 100 is shown in schematic view and consists of two side walls 110 and two end walls 120 which are connected to a bottom 130. The enclosure may be made of metal such as stainless steel or another material having sufficient strength to maintain a pressure of approximately 1–2 psi internally. Stainless steel is the preferred material for the outer enclosure 100 because of the ability to clean the material, its non-reactive nature and its acceptability in the food processing environment.

Bottom plate 100 may also be constructed so as to include integral mounting brackets 102 having a plurality of holes 101 in which mounting bolts or screws may be placed for mounting the outer enclosure 100 to a floor or other surface in a food processing facility. In a stainless steel construction the bottom plate 130, side walls 110 and end walls 120 are welded so as to form a watertight enclosure having no external crevices in which food particles could lodge.

Top plate 150 is substantially similar to bottom plate 130 except that top plate 150 has a plurality of mounting holes 105 around its periphery for the releasable attachment of top plate 150 to the side walls 110 and end walls 120. A plurality of screws 106 such as Torx® fasteners or other non-standard screws or fasteners are used to secure top plate 150 so as to limit access to the internal electronics to service personnel.

Purge valve 160 is a ball and spring type check valve which is placed through side wall 110 (or alternatively, any other exterior surface of the outer enclosure 100) in order to allow gas to flow from the inside of the outer enclosure 100 after the internal pressure exceeds approximately 1–1.5 psi.

Bulkhead fitting 170 is placed through side wall 110 (or alternatively, any other exterior surface of the outer enclosure 100) and is adapted to receive gas conduit 180 which is connected to the gas source 185 supply of nitrogen gas or instrument air which is regulated at the source to be at a pressure between approximately 2.5 and 3 psi In a preferred embodiment the purge valve is a 1 psi Kynar® coated spring loaded check valve and the gas conduit is Tygon® flexible gas tubing.

A plurality of receptacles 190 are used to provide an electrical interconnection between the interior and exterior of the outer enclosure. Receptacles 190 are preferably impervious to water and do not allow gas to pass. In a preferred embodiment of the present invention Lumberg® #RSF 4/0.5 m microstyle DC receptacles are used. In the preferred embodiment receptacles 190 are multi-pin male connectors which are mated to molded female connector (not shown) having shielded cables for connection of the electronic circuitry internal to the enclosure 100 to a central computer or other external electronics (not shown).

Figure 4:
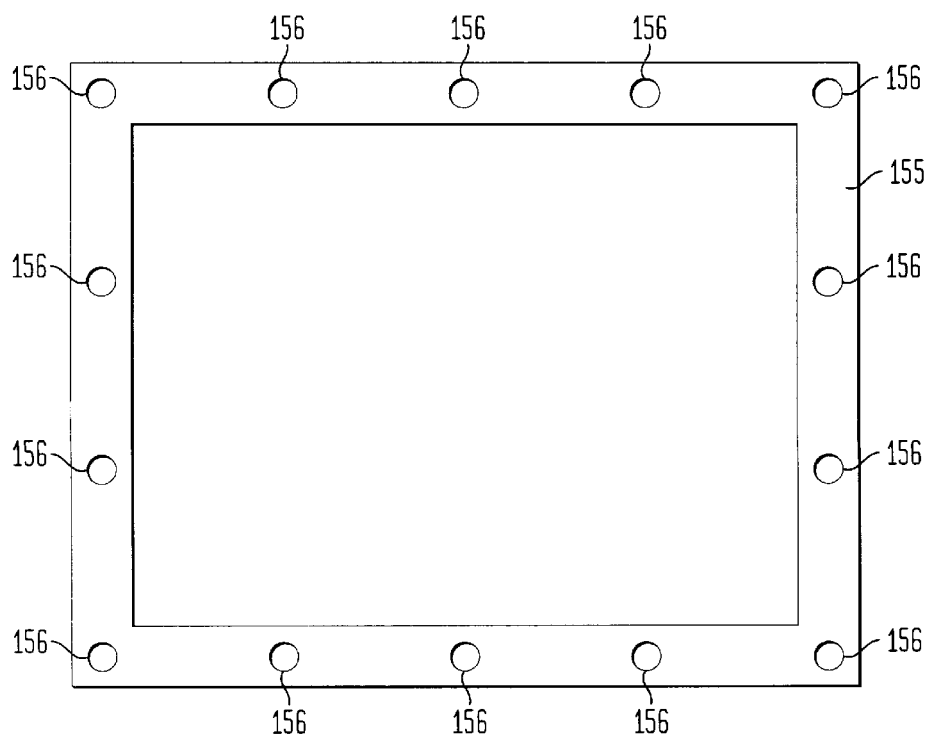
FIG. 4 is a top view of the gasket used to seal the outer enclosure.

In FIG. 2 the mounting flange 160 which runs along the periphery of the outer enclosure 100 is depicted. Mounting flange 160 has a plurality of holes 104 arranged so as to align with mounting holes 105 so as to enable the mounting of top plate 150 onto mounting flange 160 using a plurality of screws 106. FIG. 4 depicts a gasket 155 having a peripheral width of approximately one inch and a configuration of holes substantially similar to that of top plate 150. Gasket 155 is placed between the top plate 150 and the mounting flange 160 so as to ensure a watertight and pressure tight seal. The gasket material in the preferred embodiment is silicone rubber of a quality approved by the Food and Drug Administration (FDA) although other water, oil and gas, impervious gasket materials may be used.

Figure 5:
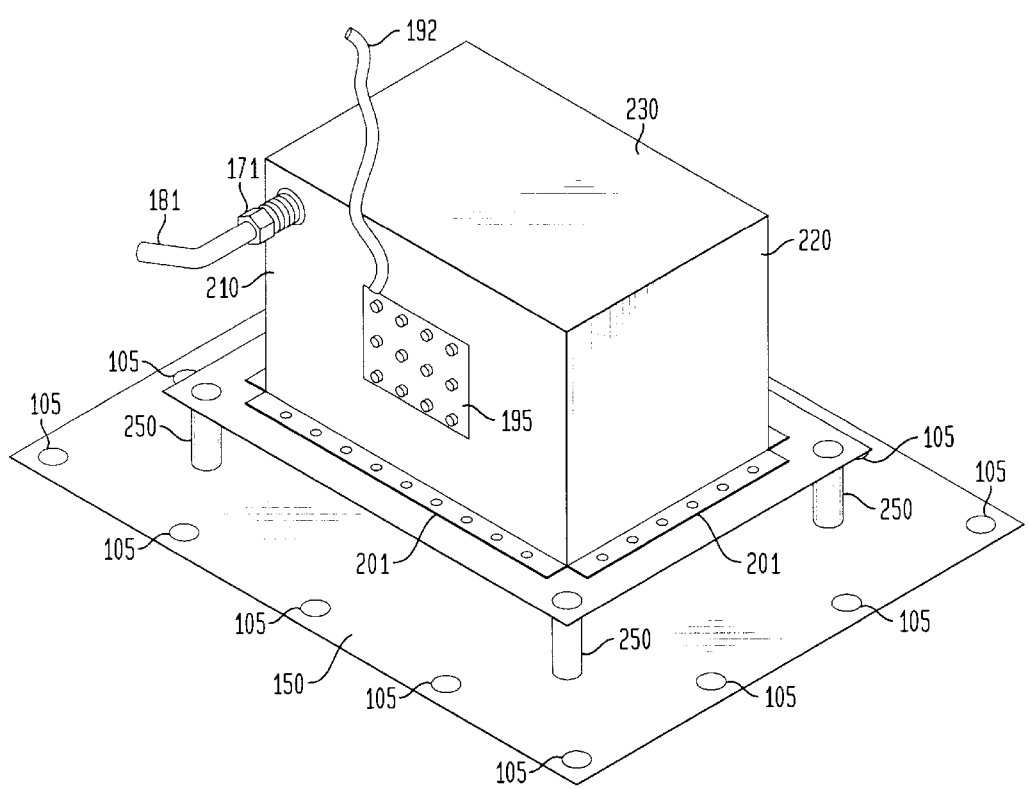
FIG. 5 is a schematic view of the inner enclosure as mounted on the underside of the top of the outer enclosure.

FIG. 5 depicts a schematic view of the inner enclosure mounted on the inside surface of top plate 150. Mounting of the inner enclosure in this manner enables quick servicing of the electronics module without need for removing the outer enclosure 100 from the food processing facility. Inner enclosure 200 is mounted on top 260 by mounting brackets 201. Electrical conductors 192 and electrical connectors 195 provide an electrical connection between the receptacles 190 which are placed through the wall of the outer enclosure 100 and the wiring which connects the electronic circuits 300 inside inner enclosure 200. Fitting 171 is adapted to except one end of a length of gas conduit 181 the other end of which is connected to the bulkhead fitting 170. Standoffs 250 separate the top 150 of the outer enclosure from the top 160 of the inner enclosure 200. Standoffs 250 are made of a material that minimizes the transfer of heat from the outer enclosure 100 to the inner enclosure 200. For example, in the preferred embodiment of the present invention where the outer enclosure 100 is made of stainless steel and the inner enclosure 200 is made of aluminum the standoffs 250 are made of stainless steel. Due to the different materials used to make the inner and outer enclosures and the standoffs heat is not as readily transferred resulting in greater protection from thermal shock.

It will be apparent to those skilled in the art that various modifications and variations can be made to the structure and methodology of the present invention without departing from the scope or spirit of the invention. In view of the foregoing, it is intended that the present invention cover modifications and variations of this invention provided they fall within the scope of the following claims and their equivalents.

We claim:

1. An apparatus for enclosing electronic circuits comprising:
   a first enclosure for housing an electronic circuit having a plurality of walls having at least one vent through one of said plurality of walls;
   a second enclosure having a plurality of walls for surrounding said first enclosure and having a purge valve mounted through one of said walls adapted to permit gas to exit said second enclosure after the pressure inside said second enclosure exceeds a predetermined value;
   a means for spacing apart said first enclosure and said second enclosure;
   a gas conduit for inputting a purge gas through said second enclosure and into said first enclosure so that a positive flow of purge gas circulates around said electronics and exits said first enclosure at said vent; and;
   a means for electrically connecting said enclosed electronic circuits with an electronic circuit external to said first and second enclosures.

2. The apparatus of claim 1 wherein said means for spacing apart said first and said second enclosures comprises a standoff.

3. The apparatus of claim 2 wherein said standoff retards thermal conduction between said first enclosure and said second enclosure.

4. The apparatus of claim 1 wherein the means for electrically connecting said electronic circuits with an external electronic circuit comprises:
   a receptacle having two ends adapted to receive a releasable connector on each end wherein said receptacle is located through a wall of said second enclosure;
   a releasable connector adapted to be connected to the end of the receptacle located on the interior side of said wall of said second enclosure;
   and a connector located through a wall of said first enclosure for electrically connecting said electronic circuits to said releasable connector.

5. The apparatus of claim 1 wherein the second enclosure is comprised of stainless steel.

6. The apparatus of claim 5 wherein the first enclosure is comprised of aluminum.

7. The apparatus of claim 1 wherein the purge gas is comprised substantially of a gas selected from the group consisting of nitrogen and instrumentation air.

8. The apparatus of claim 1 wherein the purge gas contains substantially no water vapor.

9. The apparatus of claim 2 wherein said second enclosure has at least one wall removably affixed to said second enclosure and said first enclosure is mounted through said standoffs on said at least one removably affixed walls.

10. The apparatus of claim 9 wherein said means for electrically connecting said electronic circuits with an electronic circuit external to said enclosures comprises a means for releasbly electrically interconnecting said first enclosure and said second enclosure.

11. The apparatus of claim 1 wherein said gas conduit inputs gas into said first enclosure at an end of said first enclosure opposite from said vent so as to cause said gas to flow from one end of said inner enclosure to the other.

12. An apparatus for enclosing an electronic circuit, said enclosure comprising:
   an external enclosure having a bottom and four walls;
   said external enclosure having a top adapted to be removably affixed to a top side of said four walls;
   an internal enclosure adapted for being placed internal to said external enclosure and comprising four walls, a top and a bottom;
   wherein said internal enclosure is spaced apart from said external enclosure by thermally non-conductive standoffs.

13. The apparatus of claim 12 wherein the internal enclosure is attached to an underside of said top of said external enclosure through said non-conductive standoffs.

14. The apparatus of claim 12 wherein said apparatus further comprises at least one conductor for electrical conduction from said electronic circuit to an electronic circuit external said first and second enclosures.

15. The apparatus of claim 12 further comprising a gas conduit for allowing purge gas to flow from said external enclosure to said internal enclosure.

16. The apparatus of claim 15 wherein said external enclosure further comprises a gas inlet means for allowing gas to flow through a wall of said external enclosure through said gas conduit to said internal enclosure.

17. The apparatus of claim 16 wherein said internal enclosure further comprises a gas inlet means for allowing gas to flow through said wall of said internal enclosure and at least one vent means adapted to allow gas to flow out of said internal enclosure into said external enclosure.

18. The apparatus of claim 17 wherein said external enclosure further comprises a means for releasing gas above a predetermined pressure.

19. The apparatus of claim 12 wherein said external enclosure further comprises a mounting bracket for mounting said apparatus on a surface.

20. The apparatus of claim 15 wherein said purge gas is substantially comprised of a gas selected from the group consisting of nitrogen and instrumentation air.

* * * * *